(12) United States Patent
Coffing et al.

(10) Patent No.: US 6,591,093 B1
(45) Date of Patent: Jul. 8, 2003

(54) CIRCUIT AND METHOD FOR FREQUENCY TRANSLATION

(75) Inventors: Danielle L. Coffing, Tempe, AZ (US); Jeffrey C. Durec, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/426,671

(22) Filed: Oct. 25, 1999

(51) Int. Cl.[7] .................. H04B 1/26; H04B 1/16; G06F 7/42
(52) U.S. Cl. ............... 455/319; 455/325; 455/131; 455/341; 455/333; 455/318; 455/293; 455/190.1; 455/259; 327/361
(58) Field of Search ................ 455/552, 553, 455/131, 313, 334, 341, 323, 326, 333, 318, 319, 280, 293, 188.1, 190.1, 180.1, 255, 256, 257, 258, 259, 325; 327/114, 119, 122, 355, 361

(56) References Cited

U.S. PATENT DOCUMENTS

| 5,196,742 A | * | 3/1993 | McDonald | 327/114 |
| 5,758,266 A | | 5/1998 | Kornfeld et al. | 455/86 |
| 5,826,182 A | * | 10/1998 | Gilbert | 455/333 |
| 5,886,547 A | * | 3/1999 | Durec et al. | 455/333 |
| 5,920,810 A | * | 7/1999 | Finol et al. | 455/323 |
| 5,926,751 A | | 7/1999 | Vlahos et al. | 455/280 |
| 5,999,804 A | * | 12/1999 | Forgues | 455/333 |
| 6,104,227 A | * | 8/2000 | Durec et al. | 327/356 |
| 6,211,718 B1 | * | 4/2001 | Souetinov | 455/333 |

* cited by examiner

*Primary Examiner*—William Trost
*Assistant Examiner*—Rafael Perez-Gutierrez

(57) ABSTRACT

A mixer circuit (21) includes first (31) and second (32) transconductance amplifiers, a switching circuit (34), and an oscillator processing stage (36). The transconductance amplifiers (31,32) generate differential current signals in response to modulated signals having different carrier frequencies. The oscillator processing stage (36) generates a local oscillator signal from a reference oscillator signal. The switching circuit (34) switches the differential current signals at the frequency of local oscillator signal to generate an intermediate frequency output signal.

21 Claims, 2 Drawing Sheets

CIRCUIT AND METHOD FOR FREQUENCY TRANSLATION

FIELD OF THE INVENTION

The present invention relates, in general to circuits and, more particularly, to mixer circuits for providing frequency translation.

BACKGROUND OF THE INVENTION

Conventional dual band cellular phones have two separate receiver circuits for receiving modulated signals at two different carrier frequencies. For example, a conventional dual band cellular phone has first and second receiver circuits for receiving modulated signals having carrier frequencies centered at 900 megahertz (MHz) and 1900 MHz, respectively. Each receiver circuit has its own separate mixer for translating the carrier frequency of the received modulated signal from the Radio Frequency (RF) range to a signal having a frequency in an Intermediate Frequency (IF) range.

Employing two separate mixers for generating IF signals increases the amount of die space needed and increases the power consumption of the cellular phone. As demand moves toward smaller, less expensive phones, this approach of employing two separate mixers is undesirable.

Accordingly, it would be advantageous to have a mixer circuit and method for frequency translating incoming modulated signals in a dual band phone. It would be of further advantage for the mixer circuit to have low power consumption and a minimum number of components.

DETAILED DESCRIPTION OF THE DRAWINGS

Figure 1:
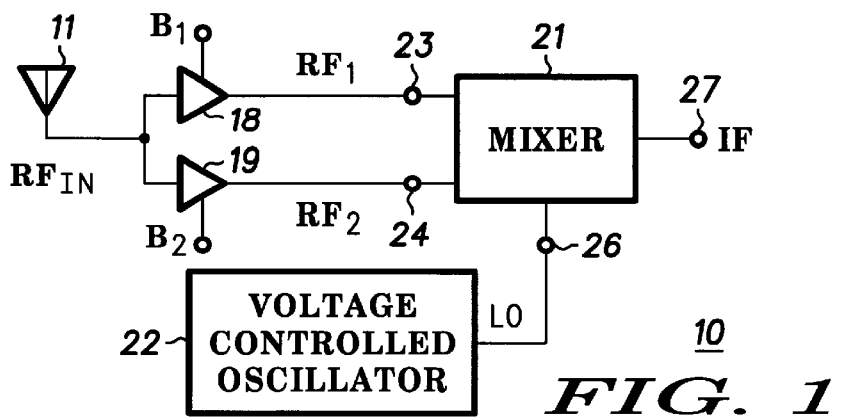
FIG. 1 is a block diagram of a portion of a receiver circuit in accordance with an embodiment of the present invention.

FIG. 1 is a block diagram of a portion of a receiver circuit 10 in accordance with an embodiment of the present invention. Receiver circuit 10 is suitable for use in wireless communication devices such as, for example, cellular phones and pagers.

Receiver circuit 10 includes an antenna 11 for receiving a modulated Radio Frequency (RF) signal labeled $RF_{IN}$. Receiver circuit 10 is a dual band receiver that can receive RF signals having different carrier frequencies of, for example, 900 megahertz (MHz) and 1900 MHz.

Antenna 11 is commonly coupled to gain stages or amplifiers 18 and 19. Amplifier 18 has an RF input terminal coupled for receiving signal $RF_{IN}$ and an enable input terminal coupled for receiving a band select signal labeled $B_1$. Amplifier 19 has an RF input terminal coupled for receiving signal $RF_{IN}$ and an enable input terminal coupled for receiving a band select signal labeled $B_2$. Band select signals $B_1$ and $B_2$ are also referred to as enable signals.

Amplifier 18 is enabled when signal $B_1$ is asserted and amplifier 19 is enabled when signal $B_2$ is asserted. Band select signals $B_1$ and $B_2$ are controlled by a control device (not shown). Examples of suitable control devices include a microprocessor, an Application Specific Integrated Circuit (ASIC), or a Digital Signal Processor (DSP). Depending on the carrier frequency of signal $RF_{IN}$, either signal $B_1$ or signal $B_2$ is asserted. For example, signal $B_1$ is asserted when the carrier frequency of signal $RF_{IN}$ is centered at a frequency of 900 MHz and signal $B_2$ is asserted when the carrier frequency of signal $RF_{IN}$ is centered at a frequency of 1900 MHz.

When amplifier 18 is enabled, amplifier 18 amplifies signal $RF_{IN}$ and generates an amplified RF signal labeled $RF_1$. Similarly, when enabled, amplifier 19 amplifies signal $RF_{IN}$ and generates an amplified RF signal labeled $RF_2$. It should be understood that in this example, the carrier frequencies of signals $RF_1$ and $RF_2$ are 900 MHz and 1900 MHz, respectively.

Receiver circuit 10 further includes a mixer 21 and a Voltage-Controlled Oscillator (VCO) 22 for frequency translation. Mixer 21 has an input terminal 23 connected to an output terminal of amplifier 18, an input terminal 24 connected to an output terminal of amplifier 19, and an input terminal 26 connected to an output terminal of VCO 22 for receiving a reference oscillator signal labeled LO. In addition, mixer 21 has an output terminal 27 for providing an intermediate frequency output signal labeled IF. By way of example, signal LO operates at a frequency of 1 gigahertz (GHz) and signal IF operates at a frequency of 100 MHz.

Depending on the carrier frequency of signal $RF_{IN}$, mixer 21 receives either signal $RF_1$ or signal $RF_2$. When the carrier frequency of signal $RF_{IN}$ is at 900 MHz, mixer 21 translates the carrier frequency of signal $RF_1$ from 900 MHz to an intermediate frequency of 100 MHz. When the carrier frequency of signal $RF_{IN}$ is centered at 1900 MHz, mixer 21 translates the carrier frequency of signal $RF_2$ from 1900 MHz to an intermediate frequency of 100 MHz. Mixer 21 is also referred to as a frequency translation circuit.

Figure 2:
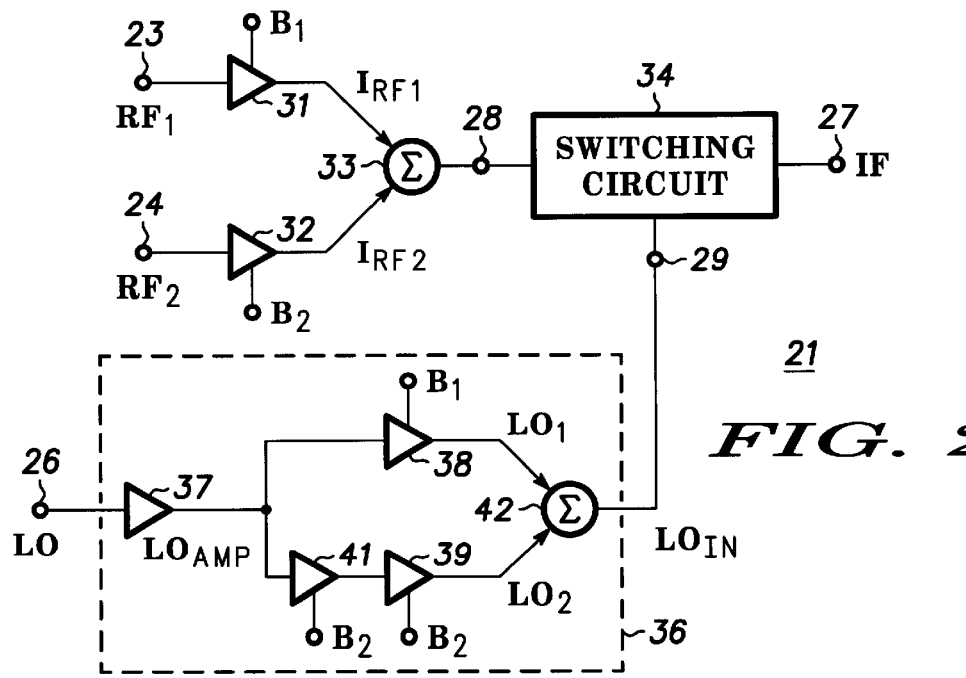
FIG. 2 is a block diagram of the mixer circuit of FIG. 1.

FIG. 2 is a block diagram of mixer 21. It should be understood that the same reference numerals are used in the figures to denote the same elements.

Mixer 21 includes transconductance amplifiers 31 and 32 for receiving input signals $RF_1$ and $RF_2$, respectively. Transconductance amplifier 31 has an RF input terminal coupled for receiving signal $RF_1$ and an enable input terminal coupled for receiving band select signal $B_1$. Further, transconductance amplifier 31 has an output terminal for providing a current signal labeled $I_{RF1}$ to a first input terminal of a summing device 33.

Transconductance amplifier 32 has an RF input terminal coupled for receiving signal $RF_2$ and an enable input terminal coupled for receiving band select signal $B_2$. In addition, transconductance amplifier 32 has an output terminal for providing a current signal labeled $I_{RF2}$ to a second input terminal of summing device 33. An output terminal of summing device 33 is connected to an input terminal 28 of a commutating circuit or switching circuit 34.

Transconductance amplifier 31 generates current signal $I_{RF1}$ at its output terminal in response to signal $RF_1$ at input terminal 23. In particular, transconductance amplifier 31 is enabled when signal $B_1$ is asserted and converts signal $RF_1$ to current signal $I_{RF1}$. Similarly, transconductance amplifier 32 is enabled when signal $B_2$ is asserted and converts signal $RF_2$ to current signal $I_{RF2}$.

Mixer 21 further includes an oscillator processing stage 36 for processing signal LO. Stage 36 generates a local oscillator signal labeled $LO_{IN}$ from reference oscillator signal LO. Stage 36 includes amplifiers 37, 38, and 39, a frequency modification element 41, and a summing device 42. Amplifier 37 has an input terminal coupled for receiving, signal LO and an output terminal commonly connected to input terminals of amplifier 38 and frequency modification element 41. Amplifier 38 has an enable input terminal coupled for receiving signal $B_1$ and an output terminal connected to a first input terminal of summing device 42.

Frequency modification element 41 has an enable input terminal coupled for receiving signal $B_2$ and an output terminal connected to an input terminal of amplifier 39. Frequency modification element 41 is an element for altering the frequency of a signal received at its input terminal. In this embodiment, frequency modification element 41 is a frequency doubler.

Amplifier 39 has an enable input terminal coupled for receiving signal $B_2$ and an output terminal connected to a second input terminal of summing device 42. Summing device 42 has an output terminal for providing signal $LO_{IN}$ to an input terminal 29 of switching circuit 34.

Amplifier 37 amplifies signal LO and generates an amplified signal labeled $LO_{AMP}$. Amplifier 37 alters the amplitude of oscillator signal LO. Depending on whether signal $B_1$ or signal $B_2$ is asserted, signal $LO_{AMP}$ is processed through a first conduction path comprising amplifier 38 or a second conduction path comprising element 41 and amplifier 39. If signal $B_1$ is asserted, then the first conduction path is enabled, i.e., amplifier 38 is enabled. Amplifier 38 amplifies signal $LO_{AMP}$ to generate an oscillator signal $LO_1$, which is transmitted from the output terminal of amplifier 38 to the first input terminal of summing device 42. On the other hand, if signal $B_2$ is asserted, then the second conduction path of stage 36 is enabled, i.e., element 41 and amplifier 39 are enabled. Element 41 doubles the frequency of signal $LO_{AMP}$ and amplifier 39 amplifies this signal to generate oscillator signal $LO_2$, which is transmitted from the output terminal of amplifier 39 to the second input terminal of summing device 42.

When signal $B_1$ is asserted, current signal $I_{RF1}$ is transmitted to terminal 28 of switching circuit 34. The first conduction path of stage 36 is enabled and signal $LO_{AMP}$ is processed via the first conduction path of stage 36. The amplitude of signal $LO_{AMP}$ is modified while the frequency of signal $LO_{AMP}$ is unaltered. Therefore, signal $LO_{IN}$ operates at a frequency of approximately 1 GHz and is substantially the same as the frequency of signal LO. Switching circuit 34 mixes signal $I_{RF1}$ operating at 900 MHz with signal $LO_{IN}$ operating at 1 GHz to generate output signal IF operating at 100 MHz.

When signal $B_2$ is asserted, current signal $I_{RF2}$ is transmitted to terminal 28 of switching circuit 34. The second conduction path of stage 36 is enabled and signal $LO_{AMP}$ is processed via the second conduction path of stage 36. Element 41 doubles the frequency of signal $LO_{AMP}$. Therefore, signal $LO_{IN}$ operates at a frequency of approximately 2 GHz. Switching circuit 34 mixes signal $I_{RF2}$ operating at 1900 MHz with signal $LO_{IN}$ operating at 2 GHz to generate output signal IF operating at 100 MHz.

Although element 41 is described as a frequency doubler, this is not a limitation of the present invention. For example, element 41 may be a frequency divider for altering the frequency of signal $LO_{AMP}$.

Figure 3:
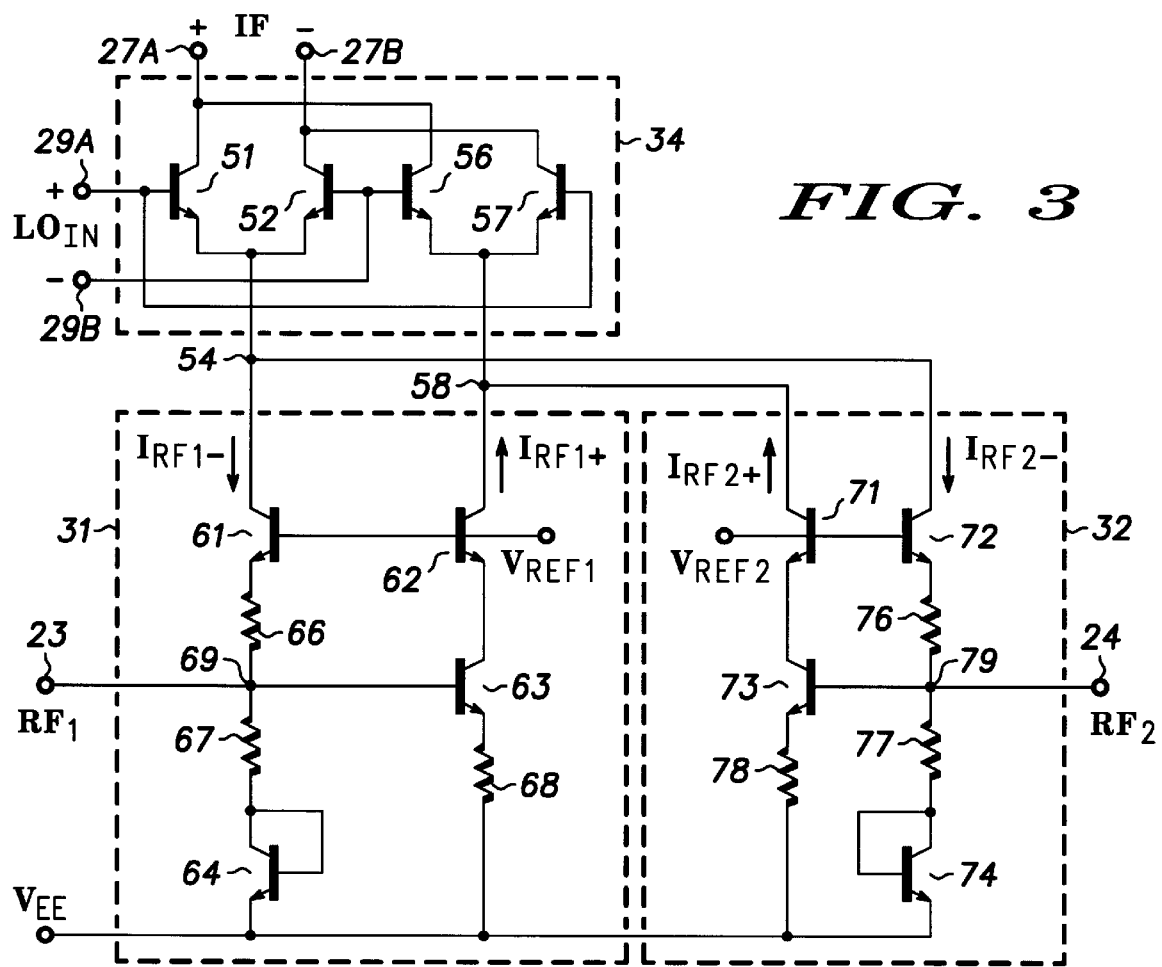
FIG. 3 is a schematic diagram of a portion of the mixer circuit of FIG. 2 in accordance with another embodiment of the present invention.

FIG. 3 is a schematic diagram of a portion of mixer 21 in accordance with another embodiment of the present invention. In particular, FIG. 3 shows switching circuit 34 and transconductance amplifiers 31 and 32. The letters A and B have been appended to reference numbers 27 and 29 to indicate that these terminals operate with differential signals. Signals $LO_{IN}$, IF, $I_{RF1}$, and $I_{RF2}$ are shown as differential signals in FIG. 3. Although signals $LO_{IN}$, IF, $I_{RF1}$, and $I_{RF2}$ are shown as differential signals, this is not a limitation of the present invention. Signals $LO_{IN}$, IF, $I_{RF1}$ and $I_{RF2}$ can also be single-ended signals.

Switching circuit 34 includes two differential pairs of bipolar transistors. More particularly, switching circuit 34 includes transistors 51 and 52 connected as a first differential pair, wherein emitter electrodes of transistors 51 and 52 are commonly connected to each other and to a node 54. Switching circuit 34 further includes transistors 56 and 57 connected as a second differential pair, wherein emitter electrodes of transistors 56 and 57 are commonly connected to each other and to a node 58.

In addition, transistors 51 and 57 have base electrodes commonly connected to each other and to terminal 29A of switching circuit 34. Transistors 52 and 56 have base electrodes commonly connected to each other and to terminal 29B. Further, transistors 51 and 56 have collector electrodes commonly connected to each other and to terminal 27A. Transistors 52 and 57 have collector electrodes commonly connected to each other and to terminal 27B.

Transconductance amplifier 31 includes bipolar transistors 61, 62, 63, and 64 and resistors 66, 67, and 68. Transistor 61 has a collector electrode connected to node 54 and a base electrode coupled for receiving a reference voltage signal labeled $V_{REF1}$, and an emitter electrode connected to a first terminal of resistor 66. A second terminal of resistor 66 is connected to a node 69 of transconductance amplifier 31. Node 69 is coupled to terminal 23 for receiving signal $RF_1$. Resistor 67 is connected between node 69 and the collector electrode of transistor 64. Transistor 64 is a diode-connected transistor having its base electrode connected to its collector electrode. The emitter electrode of transistor 64 is coupled to a power supply terminal for receiving a source of operating potential or power supply voltage such as, for example, supply voltage $V_{EE}$.

Transistor 62 has a collector electrode connected to node 58, a base electrode coupled for receiving signal $V_{REF1}$, and an emitter electrode connected to the collector electrode of transistor 63. The base electrode of transistor 63 is connected to node 69 and the emitter electrode of transistor 63 is coupled for receiving supply voltage $V_{EE}$ via resistor 68.

Transconductance amplifier 32 includes bipolar transistors 71, 72, 73, and 74 and resistors 76, 77, and 78. Transistor 71 has a collector electrode connected to node 58, a base electrode coupled for receiving a reference voltage signal $V_{REF2}$, and an emitter electrode connected to the collector electrode of transistor 73. The base electrode of transistor 73 is connected to a node 79 of transconductance amplifier 32. Node 79 is coupled to terminal 24 for receiving signal $RF_2$. The emitter electrode of transistor 73 is coupled for receiving supply voltage $V_{EE}$ via resistor 78.

Transistor 72 has a collector electrode connected to node 54, a base electrode coupled for receiving signal $V_{REF2}$, and an emitter electrode connected to a first terminal of resistor 76. A second terminal of resistor 76 is connected to node 79. Resistor 77 is connected between node 79 and the collector electrode of transistor 74, which is a diode-connected transistor. The base electrode of transistor 74 is connected to its collector electrode. The emitter electrode of transistor 74 is coupled for receiving supply voltage $V_{EE}$.

Although the transistors of switching circuit 34 and transconductance amplifiers 31 and 32 are shown as bipolar transistors, this is not a limitation of the present invention.

Alternatively, the bipolar transistors of switching circuit 34 and amplifiers 31 and 32 can be Metal Oxide Semiconductor (MOS) transistors. It should be noted that the base of a bipolar transistor is referred to as the control electrode and the collector and emitter electrodes of the bipolar transistor are referred to as current carrying electrodes or conduction electrodes. The gate electrode of a MOS transistor is also referred to as a control electrode and the drain and source electrodes of a MOS transistor are referred to as conduction electrodes.

Transistor 61, resistors 66 and 67, and transistor 64 form a first conduction path in transconductance amplifier 31. The first conduction path conducts a current signal $I_{RF1-}$ in response to signal $RF_1$ applied at terminal 23. Transistors 62 and 63 and resistor 68 form a second conduction path in transconductance amplifier 31. The second conduction path conducts a current signal $I_{RF1+}$ in response to signal $RF_1$ at terminal 23. Current signals $I_{RF1+}$ and $I_{RF1-}$ are components of differential current signal $I_{RF1}$.

Transistor 72, resistors 76 and 77, and transistor 74 form a first conduction path in transconductance amplifier 32. The first conduction path conducts a current signal $I_{RF2-}$ in response to signal $RF_2$ applied at terminal 24. Transistors 71 and 73 and resistor 78 form a second conduction path in transconductance amplifier 32. The second conduction path conducts a current signal $I_{RF2}$ in response to signal $RF_2$ at terminal 24. Current signals $I_{RF2+}$ and $I_{RF2-}$ are components of differential current signal $I_{RF2}$.

Nodes 54 and 58 operate as summing nodes and serve as summing device 33 (FIG. 2). For example, current signals $I_{RF1-}$ and $I_{RF2-}$ are summed at node 54 and current signals $I_{RF1+}$ and $I_{RF2+}$ are summed at node 58. In this example, when the carrier frequency of the received signal $RF_{IN}$ (FIG. 1) is centered at a frequency of 900 MHz, transconductance amplifier 31 is enabled and transconductance amplifier 32 is disabled. Therefore, only current signals $I_{RF1-}$ and $I_{RF1+}$ are transmitted to nodes 54 and 58, respectively. On the other hand, when the carrier frequency of the received signal $RF_{IN}$ is centered at a frequency of 1900 MHz, transconductance amplifier 31 is disabled and transconductance amplifier 32 is enabled. Therefore, only current signals $I_{RF2-}$ and $I_{RF2+}$ are transmitted to nodes 54 and 58, respectively.

Transistors 51 and 52 and transistors 56 and 57 operate as a switching circuit under control of differential signal $LO_{IN}$. When $LO_{IN+}$ at terminal 29A is greater than $LO_{IN-}$ at terminal 29B, transistors 51 and 57 conduct currents at nodes 54 and 58, respectively. When $LO_{IN-}$ is greater than $LO_{IN+}$, transistors 52 and 56 conduct currents from nodes 54 and 58, respectively. $LO_{IN+}$ and $LO_{IN-}$ are components of differential signal $LO_{IN}$.

When transconductance amplifier 31 is enabled, signal $RF_1$ is converted to differential current signal $I_{RF1}$ at the collectors of transistors 61 and 62. Differential current signal $I_{RF1}$ is switched between transistors 51, 52, 56, and 57 at the frequency of oscillator signal $LO_{IN}$. Therefore, signal $RF_1$ operating at 900 MHz is downconverted by signal $LO_{IN}$ operating at 1 GHz to an IF signal operating at 100 MHz.

When transconductance amplifier 32 is enabled, signal $RF_2$ is converted to differential current signal $I_{RF2}$ at the collectors of transistors 71 and 72. Differential current signal $I_{RF2}$ is switched between transistors 51, 52, 56, and 57 at the frequency of oscillator signal $LO_{IN}$. Therefore, signal $RF_2$ operating at 1900 MHz is downconverted by signal $LO_{IN}$ operating at 2 GHz to an IF signal operating at 100 MHz.

Referring back to FIG. 1, when the carrier frequency of signal $RF_{IN}$ is centered at a frequency of 900 MHz, mixer 21 generates signal IF having a frequency that is the difference between 1 GHz and 900 MHz, i.e., a frequency of 100 MHz. On the other hand, when the carrier frequency of signal $RF_{IN}$ is centered at a frequency of 1900 MHz, mixer 21 generates signal IF having a frequency that is the difference between 2 GHz and 1900 MHz, i.e., a frequency of 100 MHz. Therefore, mixer 21 has multiple inputs for receiving modulated RF signals having different carrier frequencies, a single local oscillator input, and a single intermediate frequency output.

It should be noted that mixer 21 can generate both sum and difference signals. The choice of which signal to select is a design choice and is accomplished by coupling a filter circuit (not shown) to mixer 21.

Mixer 21 can be modified to accommodate receiving RF signals having more than two carrier frequencies, suitable for use in a tri-band cellular phone. For example, referring to FIG. 2, a third transconductance amplifier can be coupled to summing device 33 and an additional conduction path can be added between amplifier 37 and summing device 42. This third transconductance amplifier and additional conduction path can be enabled by a third band select signal. The additional conduction path may include an amplifier, a frequency doubler, or a frequency divider.

Figure 4:
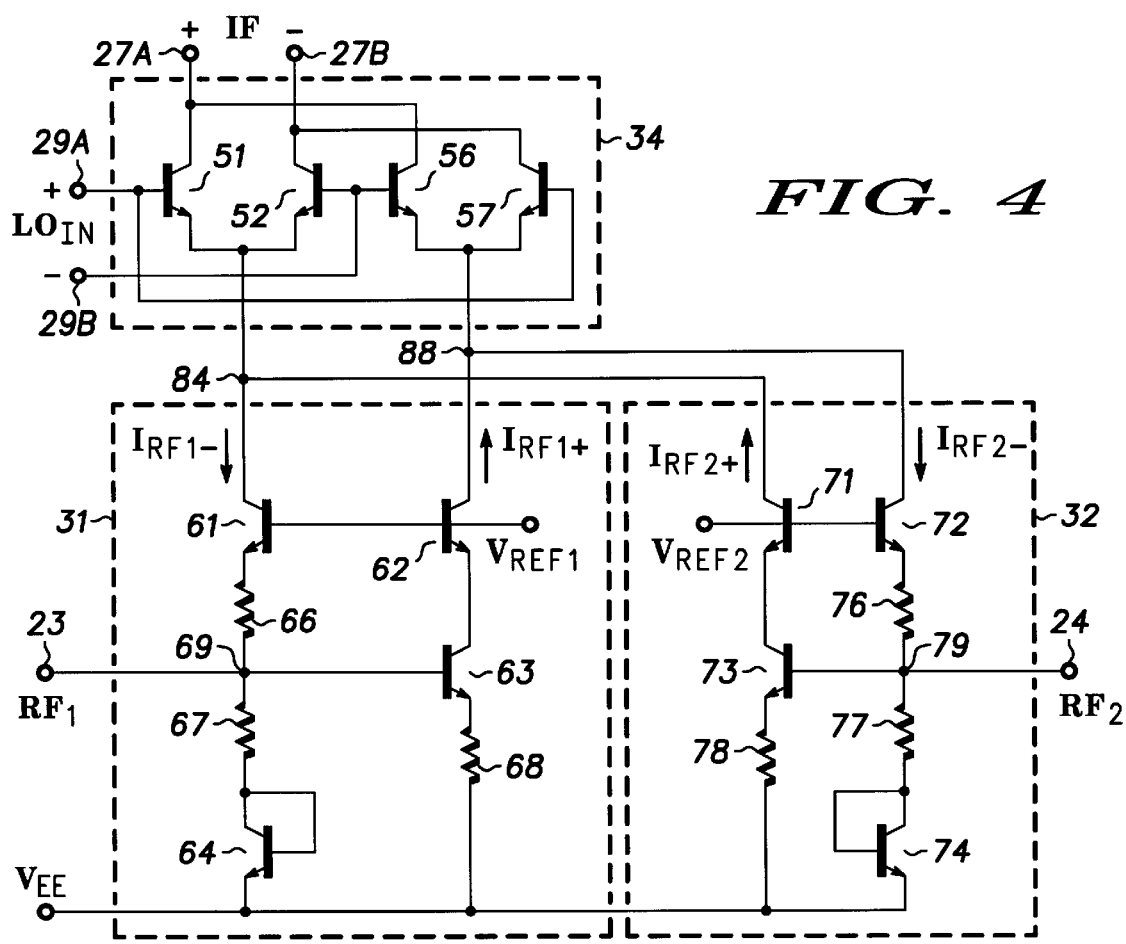
FIG. 4 is a schematic diagram of a portion of the mixer circuit of FIG. 2 in accordance with yet another embodiment of the present invention.

FIG. 4 is a schematic diagram of a portion of the mixer circuit 21 in accordance with yet another embodiment of the present invention. The embodiment shown in FIG. 4 is similar to the embodiment shown in FIG. 3 except that the collector electrode of transistor 61 is connected to the collector electrode of transistor 71 to form a node 84 and the collector electrode of transistor 62 is connected to the collector electrode of transistor 72 to form a node 88.

The operation of nodes 84 and 88 is similar to the operation of nodes 54 and 58 of FIG. 3. That is, nodes 84 and 88 operate as summing nodes and serve as summing device 33 (FIG. 2). In this embodiment, current signals $I_{RF1-}$ and $I_{RF2+}$ are summed at node 84 and current signals $I_{RF1+}$ and $I_{RF2-}$ are summed at node 88.

By now it should be appreciated that a mixer circuit and method for translating modulated signals having more than one carrier frequency is provided. An advantage of the mixer circuit is that it consumes less power than prior art mixer circuits because it uses fewer components. Further, the present invention provides a mixer circuit for use in both dual band and tri-band cellular phones.

What is claimed is:

1. A circuit, comprising:
a mixer having a first input coupled to an antenna, a second input coupled to the antenna, a third input coupled for receiving a first oscillator signal, and an output for providing an output signal, wherein the mixer includes:
a switching circuit having an output for providing the output signal; and
an oscillator processing stage for processing the first oscillator signal to generate a second oscillator signal, wherein the second oscillator signal is transmitted to an input of the switching circuit, said oscillator processing stage comprising:
a first amplifier having an input coupled for receiving the first oscillator signal and an output;
a second amplifier having an input coupled to the output of the first amplifier and an output;
a summing circuit having a first input coupled to the output of the second amplifier, a second input, and an output for providing a second oscillator signal;

a frequency modification element having an input coupled to the output of the fist amplifier and an output; and a third amplifier having an input coupled to the output of the frequency modification element and an output coupled to the second input of the summing circuit.

2. The circuit of claim 1, wherein the mixer further includes:

a first transconductance amplifier having an input coupled to the antenna and an output;

a second transconductance amplifier having an input coupled to the antenna and an output; and a summing device having a first input coupled to the output of the first transconductance amplifier, a second input coupled to the output of the second transconductance amplifier, and an output coupled to a second input of the switching circuit.

3. A frequency translation circuit, comprising:

a first transconductance circuit for generating a first current in response to a first input signal operating at a first frequency;

a second transconductance circuit for generating a second current in response to a second input signal operating at a second frequency; and an oscillator processing stage for providing a third input signal, said oscillator processing stage comprising:
  a summing device having an output for providing the third input signal;
  a first conduction path for conducting a first oscillator signal to a first input of the summing device; and
  a second conduction path for conducting a second oscillator signal to a second input of the summing device; and a switching circuit coupled for receiving the first and second currents and responsive to a said third input signal for switching the first and second currents to provide an output signal operating at a third frequency.

4. The frequency translation circuit of claim 3, wherein the switching circuit includes:

a first transistor having a first conduction electrode coupled to a first node of the frequency translation circuit, a control electrode coupled for receiving a first component of the third input signal, and a second conduction electrode for providing a first component of the output signal, wherein the first node is coupled for receiving a first component of the first current and a first component of the second current;

a second transistor having a first conduction electrode coupled to the first node, a control electrode coupled for receiving a second component of the third input signal, and a second conduction electrode for providing a second component of the output signal;

a third transistor having a first conduction electrode coupled to a second node of the frequency translation circuit, a control electrode coupled for receiving the second component of the third input signal, and a second conduction electrode for providing the first component of the output signal, wherein the second node is coupled for receiving a second component of the first current and a second component of the second current; and a fourth transistor having a first conduction electrode coupled to the second node, a control electrode coupled for receiving the first component of the third input signal, and a second conduction electrode for providing the second component of the output signal.

5. The frequency translation circuit of claim 3, wherein the first transconductance circuit includes first and second conduction paths for respectively conducting first and second components of the first current in response to the first input signal.

6. The frequency translation circuit of claim 5, wherein the first conduction path includes:

a first transistor having a control electrode coupled for receiving a first reference voltage, a first conduction electrode for providing the first component of the first current, and a second conduction electrode coupled to a first node of the first transconductance circuit, wherein the first node is coupled for receiving the first input signal; and a second transistor having a first conduction electrode coupled to the first node, a control electrode coupled to the first conduction electrode of the second transistor, and a second conduction electrode coupled for receiving a power supply voltage.

7. The frequency translation circuit of claim 6, wherein the second conduction path includes:

a third transistor having a control electrode coupled for receiving the first reference voltage, a first conduction electrode for providing the second component of the first current, and a second conduction electrode;

a fourth transistor having a control electrode coupled to the first node, a first conduction electrode coupled to the second conduction electrode of the third transistor, and a second conduction electrode; and a resistor having a first terminal coupled to the second conduction electrode of the fourth transistor and a second terminal coupled for receiving the power supply voltage.

8. The frequency translation circuit of claim 6, wherein the first conduction path further includes:

a first resistor coupled between the second conduction electrode of the first transistor and the first node; and a second resistor coupled between the first node and the first conduction electrode of the second transistor.

9. The frequency translation circuit of claim 3, wherein the second transconductance circuit includes first and second conduction paths for respectively conducting first and second components of the second current in response to the second input signal.

10. The frequency translation circuit of claim 9, wherein the first conduction path includes:

a first transistor having a control electrode coupled for receiving a first reference voltage, a first conduction electrode for providing the first component of the second current, and a second conduction electrode coupled to a first node of the second transconductance circuit, wherein the first node is coupled for receiving the second input signal; and a second transistor having a first conduction electrode coupled to the first node, a control electrode coupled to the first conduction electrode of the second transistor, and a second conduction electrode coupled for receiving a power supply voltage.

11. The frequency translation circuit of claim 10, wherein the second conduction path includes:

a third transistor having a control electrode coupled for receiving the first reference voltage, a first conduction electrode for providing the second component of the second current, and a second conduction electrode;

a fourth transistor having a first conduction electrode coupled to the second conduction electrode of the third transistor, a control electrode coupled to the first node, and a second conduction electrode; and a resistor having a first terminal coupled to the second conduction electrode of the fourth transistor and a second terminal coupled for receiving the power supply voltage.

12. The frequency translation circuit of claim 10, wherein the first conduction path further includes:

a first resistor coupled between the second conduction electrode of the first transistor and the first node; and a second resistor coupled between the first node and the first conduction electrode of the second transistor.

13. The frequency translation circuit of claim 3, wherein the first conduction path includes a gain stage having an input coupled for receiving a third oscillator signal and an output for providing the first oscillator signal.

14. The frequency translation circuit of claim 13, wherein the second conduction path includes a frequency modification element having an input coupled for receiving the third oscillator signal and an output coupled to the second input of the summing device.

15. The frequency translation circuit of claim 14, wherein the second conduction path further includes a second gain stage coupled between the output of the frequency modification element and the second input of the summing device.

16. The frequency translation circuit of claim 15, wherein the frequency modification element is a frequency doubler.

17. The frequency translation circuit of claim 3, wherein the first conduction path is enabled by a first band select signal and the second conduction path is enabled by a second band select signal.

18. A method for frequency translation, comprising the steps of:

receiving a modulated signal;

asserting a first enable signal when a carrier frequency of the modulated signal is at a first frequency;

generating a first current when the first enable signal is asserted;

generating a first oscillator signal from a reference oscillator signal when the fist enable signal is asserted, wherein a frequency of the first oscillator signal is different than a frequency of the reference oscillator signal; and switching the first current in response to the first oscillator signal to generate an output signal.

19. The method of claim 18, further comprising the steps of:

asserting a second enable signal when the carrier frequency of the modulated signal is at a second frequency;

generating a second current when the second enable signal is asserted;

generating a second oscillator signal from the reference oscillator signal when the second enable signal is asserted, wherein a frequency of the second oscillator signal is substantially the same as the frequency of the reference oscillator signal; and switching the second current in response to the second oscillator signal to generate the output signal.

20. The method of claim 19, further comprising the step of summing the first current and the second current.

21. The method of claim 20, further comprising the step of summing the first oscillator signal an d the second oscillator signal.

* * * * *